United States Patent
Yamamoto et al.

(10) Patent No.: US 11,848,171 B2
(45) Date of Patent: Dec. 19, 2023

(54) CHARGED PARTICLE BEAM DEVICE AND CHARGED PARTICLE BEAM DEVICE CALIBRATION METHOD

(71) Applicant: Hitachi High-Tech Corporation, Tokyo (JP)

(72) Inventors: Akio Yamamoto, Tokyo (JP); Wen Li, Tokyo (JP); Hiroshi Oinuma, Tokyo (JP); Shunsuke Mizutani, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 204 days.

(21) Appl. No.: 17/587,935

(22) Filed: Jan. 28, 2022

(65) Prior Publication Data

US 2022/0246392 A1 Aug. 4, 2022

(30) Foreign Application Priority Data

Feb. 1, 2021 (JP) .................... 2021-014254

(51) Int. Cl.
  *H01J 37/244* (2006.01)
  *H01J 37/28* (2006.01)
  *H01J 37/22* (2006.01)
  *H01J 37/26* (2006.01)

(52) U.S. Cl.
  CPC .......... *H01J 37/244* (2013.01); *H01J 37/222* (2013.01); *H01J 37/265* (2013.01); *H01J 37/28* (2013.01); *H01J 2237/2443* (2013.01); *H01J 2237/2826* (2013.01)

(58) Field of Classification Search
  CPC .......... H01J 37/00; H01J 37/02; H01J 37/244; H01J 37/222; H01J 37/265; H01J 37/26; H01J 37/28; H01J 37/304; H01J 2237/2443; H01J 2237/2826

USPC .......................................... 250/306, 307, 311
See application file for complete search history.

(56) References Cited

U.S. PATENT DOCUMENTS

| | | | |
|---|---|---|---|
| 8,735,849 B2 | 5/2014 | Hlavenka | |
| 9,494,856 B1 | 11/2016 | Fang | |
| 2013/0270439 A1* | 10/2013 | Adamec | H01J 37/244 250/394 |

(Continued)

FOREIGN PATENT DOCUMENTS

JP 6012191 B 10/2016

OTHER PUBLICATIONS

Reimer, "Scanning Electron Microscopy—Physics of Image Formation and Microanalysis," Springer, (1998).

*Primary Examiner* — Jason L Mccormack
(74) *Attorney, Agent, or Firm* — Volpe Koenig (57) ABSTRACT

Provided is a charged particle beam device and a charged particle beam device calibration method capable of correcting an influence of characteristic variation and noise with high accuracy. Control units execute a first calibration of correcting a characteristic variation between a plurality of channels in detectors and signal processing circuits by using a setting value of a control parameter for each of the plurality of channels in a state in which a primary electron beam is not emitted. The control units further execute a second calibration of correcting a characteristic variation between the plurality of channels in scintillators or the like by using the setting value of the control parameter for each of the plurality of channels in a state in which the primary electron beam is emitted.

13 Claims, 7 Drawing Sheets

(56) References Cited

U.S. PATENT DOCUMENTS

2017/0169993 A1* 6/2017 Iizuka .................. H01J 37/045
2017/0194125 A1   7/2017 Kris et al.
2019/0088444 A1   3/2019 Attal et al.

* cited by examiner

CHARGED PARTICLE BEAM DEVICE AND CHARGED PARTICLE BEAM DEVICE CALIBRATION METHOD

BACKGROUND OF THE INVENTION

1. Field of the Invention

The present invention relates to a charged particle beam device and a charged particle beam device calibration method, and, for example, relates to a technique for detecting charged particles discharged from a sample in response to emission of a charged particle beam and forming an image based on the charged particles.

2. Description of the Related Art

A scanning electron microscope (SEM) used for evaluation and measurement of a semiconductor device is known as one of charged particle beam devices. In measurement using the SEM, when a sample is irradiated with a primary electron beam, signal electrons having various energies are emitted in various directions due to interaction between the electrons and the sample. The signal electrons are mainly distinguished into secondary electrons (SE) and back scattered electrons (BSE). For example, the secondary electrons are signal electrons emitted at an energy of 50 eV or less, and the back scattered electrons are signal electrons which are emitted at an energy larger than this energy and are close to that of the primary electron beam.

As a technique related to such a charged particle beam device, L. Reimer, Scanning Electron Microscope (1998, Springer) describes that the secondary electrons are sensitive to a surface shape and an electric potential of the sample. US Patent Application Publication No. 2019/0088444 discloses a configuration using a plurality of BSE detectors that detect the back scattered electrons.

In recent years, a structure of the semiconductor device has been miniaturized and has become three-dimensional, and is required of diversified evaluation values by customers such as a semiconductor device manufacturer. In particular, the three-dimensional device structure causes an increasing need for measurement of a bottom dimension of a hole or a groove shape in a semiconductor substrate with high accuracy in order to improve a yield.

Regarding this, a method for detecting secondary electrons, which are one type of the signal electrons, is useful for measurement of a dimension of a surface structure such as a pattern width of a semiconductor device structure, but is not suitable for a 3D structure such as a hole or groove. A reason is that the secondary electrons cannot escape from the hole or groove since the secondary electrons are absorbed by a side wall, for example.

On the other hand, the back scattered electrons include information on a composition and a three-dimensional shape of the sample, and include information such as the 3D structure or a difference in composition between the surface and the bottom. In addition, the back scattered electrons have a high energy, and thus can escape from the hole or groove through the side wall. Therefore, a method for detecting back scattered electrons, which are another type of the signal electrons, is useful for measurement of the 3D structure including the bottom of the hole or groove structure. Further, the signal electrons discharged from the sample have different information on the sample depending on an emission energy and an emission angle, and a classifying detection of the signal electrons is indispensable for diversified measurements. Therefore, for example, it is useful to use a plurality of BSE detectors as disclosed in US Patent Application Publication No. 2019/0088444.

A device using a plurality of BSE detectors, however, may particularly have problems of characteristic variation in a signal processing unit and characteristic variation in an optical component. Examples of the characteristic variation in the signal processing unit include a variation in the BSE detectors, a variation in a signal processing circuit that processes a detection signal of each BSE detector, a variation in a power supply of the BSE detectors, and the like. Examples of the characteristic variation in the optical component include variation in an electron-optical converter (scintillator), a light guide, and the like.

Such characteristic variation affects a length measurement performance of the SEM. Photomul used as the BSE detector or a semiconductor photodetector generates a dark current (dark pulse) as a noise even without incident photons, which reduces S/N of a detection image of the SEM. For this reason, analyzation of the detection image of the SEM in detail and with high accuracy requires a mechanism for correcting an influence of the characteristic variation and the noise with high accuracy.

SUMMARY OF THE INVENTION

The invention has been made in view of the above, and an object of the invention is to provide a charged particle beam device and a charged particle beam device calibration method capable of correcting an influence of characteristic variation and noise with high accuracy.

The above and other purposes and novel features of the invention will become apparent from the description of this specification and the accompanying drawings.

An outline of a representative one of the embodiments disclosed in the present application will be briefly described as follows.

A charged particle beam device according to a representative embodiment of the invention includes: detection systems of a plurality of channels; and a control unit configured to control characteristics of the detection systems of the plurality of channels by using a setting value of a control parameter. Each of the detection systems of the plurality of channels includes: a detector configured to detect charged particles discharged from a sample in response to irradiation of a charged particle beam, an optical component arranged at a stage preceding to the detector, and a signal processing circuit configured to process a detection signal from the detector. The control unit is configured to execute a first calibration of correcting a characteristic variation between the plurality of channels in the detector and the signal processing circuit by using the setting value of the control parameter for each of the plurality of channels in a state in which the charged particle beam is not emitted. The control unit is further configured to execute a second calibration of correcting a characteristic variation between the plurality of channels in the optical component by using the setting value of the control parameter for each of the plurality of channels in a state in which the charged particle beam is emitted.

To briefly explain the effects obtained by the representative embodiment of the inventions disclosed in the present application, it is possible to correct an influence of characteristic variation and noise in a charged particle beam device with high accuracy.

DESCRIPTION OF THE PREFERRED EMBODIMENTS

Hereinafter, various embodiments of the invention will be described in order with reference to the drawings. In the following embodiments, a case where a charged particle beam device is a scanning electron microscope (SEM) using an electron beam will be described as an example. However, the charged particle beam device is not limited to the scanning electron microscope (SEM), and may be, for example, an ion microscope using an ion beam, or may be an inspection device using an X-ray such as a computed tomography (CT) device.

First Embodiment

Configuration of Charged Particle Beam Device

Figure 1:
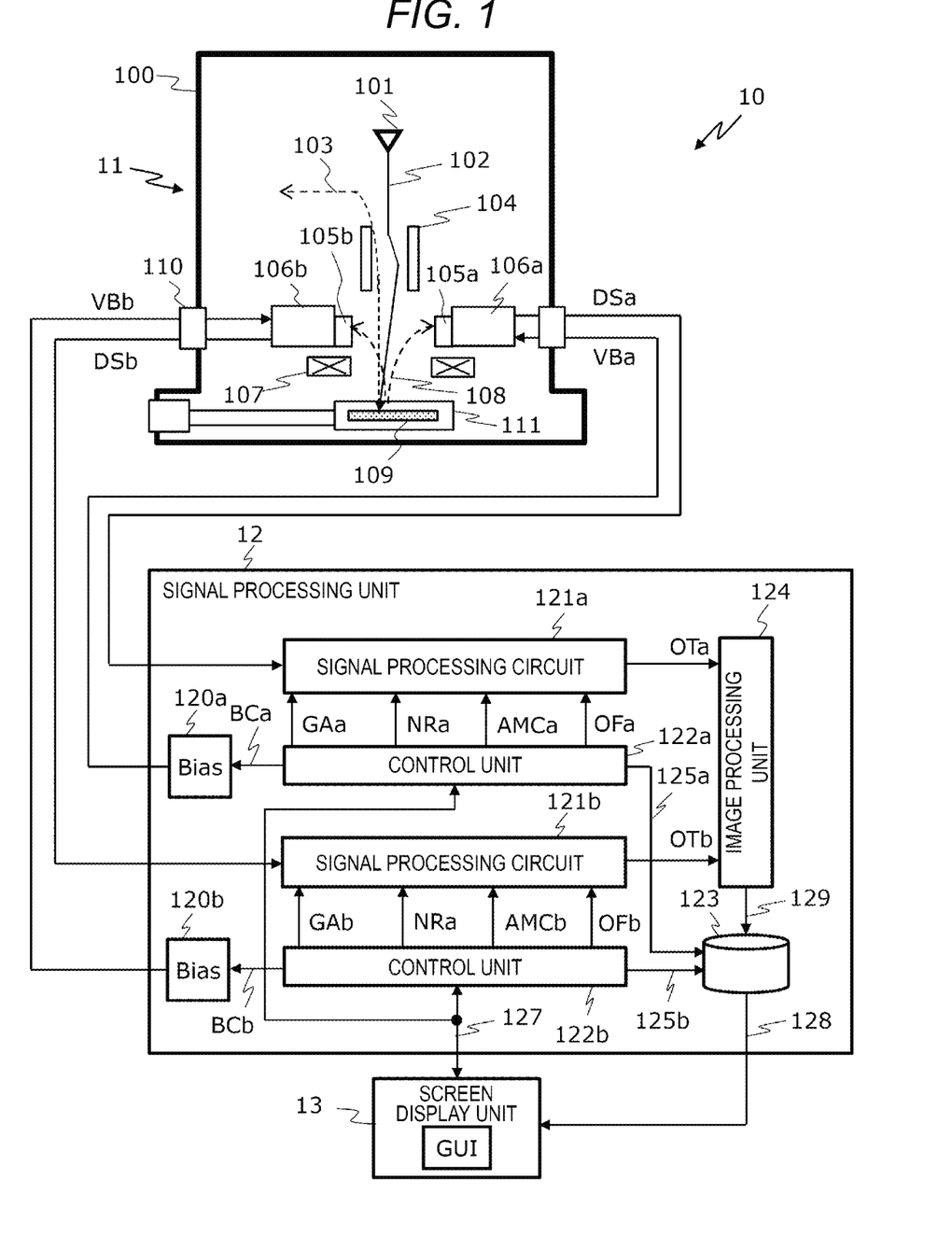
FIG. 1 is a schematic diagram showing a configuration example of a main unit in a charged particle beam device according to a first embodiment of the invention.

FIG. 1 is a schematic diagram showing a configuration example of a main unit in a charged particle beam device according to a first embodiment of the invention. A charged particle beam device 10 shown in FIG. 1 includes an electron microscope main body 11, a signal processing unit 12, and a screen display unit 13. The electron microscope main body 11 includes a column 100 for constructing a vacuum environment. An electron gun 101 is arranged inside the column 100. A primary electron beam 102 discharged from the electron gun 101 flies along a primary electron beam optical axis. A deflector 104 adjusts a trajectory of the primary electron beam 102 from the electron gun 101, and an objective lens 107 converges the trajectory-adjusted primary electron beam 102 on a sample 109 arranged on a sample stage 111.

A negative voltage is applied to the sample 109 via the sample stage 111. Therefore, the primary electron beam 102 collides with the sample 109 with an energy smaller than an energy when the primary electron beam 102 is discharged from the electron gun 101. The sample 109 discharges signal electrons in response to irradiation of the primary electron beam 102. The signal electrons include back scattered electrons 108 and secondary electrons 103. The signal electrons fly within the column 100 according to respective emission energies and the emission angles. The primary electron beam 102 is one of charged particle beams, and the signal electrons are one type of the charged particles.

The charged particle beam device 10 of FIG. 1 includes detection systems of a plurality of channels (two channels in this example). A detection system of a channel A includes a scintillator 105a which is an optical component, a detector 106a, and a signal processing circuit 121a. Similarly, a detection system of a channel B includes a scintillator 105b which is an optical component, a detector 106b, and a signal processing circuit 121b. The scintillators 105a and 105b and the detectors 106a and 106b are arranged inside the column 100, and the signal processing circuits 121a and 121b are provided in the signal processing unit 12.

The scintillators 105a and 105b are arranged in stages preceding to the detectors 106a and 106b, and convert the back scattered electrons 108 from the sample 109 into light when the back scattered electrons 108 are incident. The detectors 106a and 106b are, for example, a silicon photomultiplier (SiPM), a multi-pixel photon counter (MPPC), an avalanche photodiode (APD), or a photomultiplier tube (PMT). The detectors 106a and 106b convert the light from the scintillators 105a and 105b into detection signals DSa and DSb, which are electrical signals, and output the detection signals DSa and DSb via a hermetic seal 110.

The signal processing unit 12 includes, in addition to the signal processing circuits 121a and 121b, bias power supplies 120a and 120b for detectors, control units 122a and 122b, a memory 123, and an image processing unit 124. The memory 123 is configured with, for example, a combination of a random access memory (RAM) and a nonvolatile memory. The signal processing circuits 121a and 121b process the detection signals DSa and DSb from the detectors 106a and 106b, respectively. The bias power supplies 120a and 120b adjust gains of the detectors 106a and 106b by supplying bias voltages VBa and VBb to the detectors 106a and 106b via the hermetic seal 110.

Each of the signal processing circuits 121a and 121b includes, for example, an analog-to-digital converter, and an amplifier, a variable gain amplifier, a filter, a multiplier, an adder, a subtractor, a clamp circuit, and the like provided at a stage subsequent to the analog-to-digital converter. That is, in this example, the signal processing circuits 121a and 121b perform a processing such as amplification by a digital processing.

The control unit 122a controls characteristics of the detection system of the channel A, specifically, characteristics of the detector 106a and the signal processing circuit 121a, using setting values of control parameters. The setting values of the control parameters include gains and offset values for the detector 106a and the signal processing circuit 121a, a threshold value for removing a dark pulse from the detector 106a, and a load regulation correction value. A magnitude of the setting value of each control parameter is determined by a parameter control signal.

The parameter control signal includes a gain adjustment signal GAa, a noise removal signal NRa, an amplitude correction signal AMCa, an offset adjustment signal OFa, and a bias control signal BCa. The bias control signal BCa is a signal for adjusting the values of the bias voltages VBa and VBb and the gains of the detectors 106a and 106b via the bias power supplies 120a and 120b. The gain adjustment signal GAa is a signal for adjusting the gain of the signal processing circuit 121a, thereby adjusting brightness of an image and the like.

The noise removal signal NRa is a signal for adjusting a threshold value for removing noise including the dark pulse from the detector 106a, that is, a threshold value for distinguishing a noise component from a signal component. The amplitude correction signal AMCa is a signal for correcting an amplitude variation generated by a load regulation, and is, for example, a signal for adjusting a correction coefficient or the like, which is the load regulation correction value. The offset adjustment signal OFa is a signal for adjusting the offset value of the signal processing circuit 121a, thereby adjusting a contrast of the image.

Similarly, the control unit 122b controls characteristics of the detection system of the channel B, specifically, characteristics of the detector 106b and the signal processing circuit 121b, using the setting values of the control parameters. The parameter control signal for determining the setting values of the control parameters includes a gain adjustment signal GAb, a noise removal signal NRb, an amplitude correction signal AMCb, an offset adjustment signal OFb, and a bias control signal BCb.

Output signals OTa and OTb from the signal processing circuits 121a and 121b are input to the image processing unit 124. The output signals OTa and OTb may be continuous signals or discrete signals represented by a signal amplitude histogram (see FIG. 4). The image processing unit 124 generates an image representing a shape of the sample 109 by obtaining a gradation value for each unit time, in other words, for each pixel, based on the output signals OTa and OTb from the signal processing circuits 121a and 121b.

Further, the image processing unit 124 creates a frequency distribution of the gradation value of each pixel, that is, a pixel gradation histogram, and obtains a luminance value, a contrast value, and the like of the image. The image processing unit 124 stores data generated by such a processing in the memory 123 as image data 129. Although details will be described later, the image data 129 also includes various types of data at a no signal time, in addition to the data such as the image acquired with the sample 109 as a target, the pixel gradation histogram, the luminance value, and the contrast value. In addition to the image data 129 input from the image processing unit 124, the memory 123 stores setting values 125a and 125b of the control parameters input from the control units 122a and 122b as attached data of the image data 129.

The screen display unit 13 is, for example, a graphical user interface (GUI), and displays device data 128 stored in the memory 123 on a screen as an image and a text. The device data 128 includes the image data 129 and the setting values 125a and 125b of the control parameters attached to the image data 129.

The control units 122a and 122b and the image processing unit 124 in FIG. 1 are typically implemented by a processor such as a central processing unit (CPU), a graphics processing unit (GPU), or a digital signal processor (DSP) executing a program stored in the memory 123. The signal processing circuits 121a and 121b in FIG. 1 are typically implemented by a combination of the analog-to-digital converter and a program processing by the processor.

However, the control units 122a and 122b and the image processing unit 124 are not limited to such software, and may be implemented by hardware such as a field programmable gate array (FPGA) or an application specific integrated circuit (ASIC), or may be implemented by a combination of hardware and software. In addition, the signal processing circuits 121a and 121b may be partially configured with hardware such as an FPGA or an ASIC, and the signal processing circuits 121a and 121b may be both configured as an analog circuit.

Here, the signal processing unit 12 in FIG. 1 is typically configured with a wiring board on which a microcontroller or the like is mounted. In this case, the signal processing circuits 121a and 121b, the control units 122a and 122b, and the image processing unit 124 may be mounted on the microcontroller or the like with the analog-to-digital converters being included in the signal processing circuits 121a and 121b. The memory 123 may also be mounted on the microcontroller or the like. The screen display unit 13 in FIG. 1 is configured with a general display typified by a liquid crystal display or the like, for example.

Schematic Operation of Charged Particle Beam Device

Figure 2:
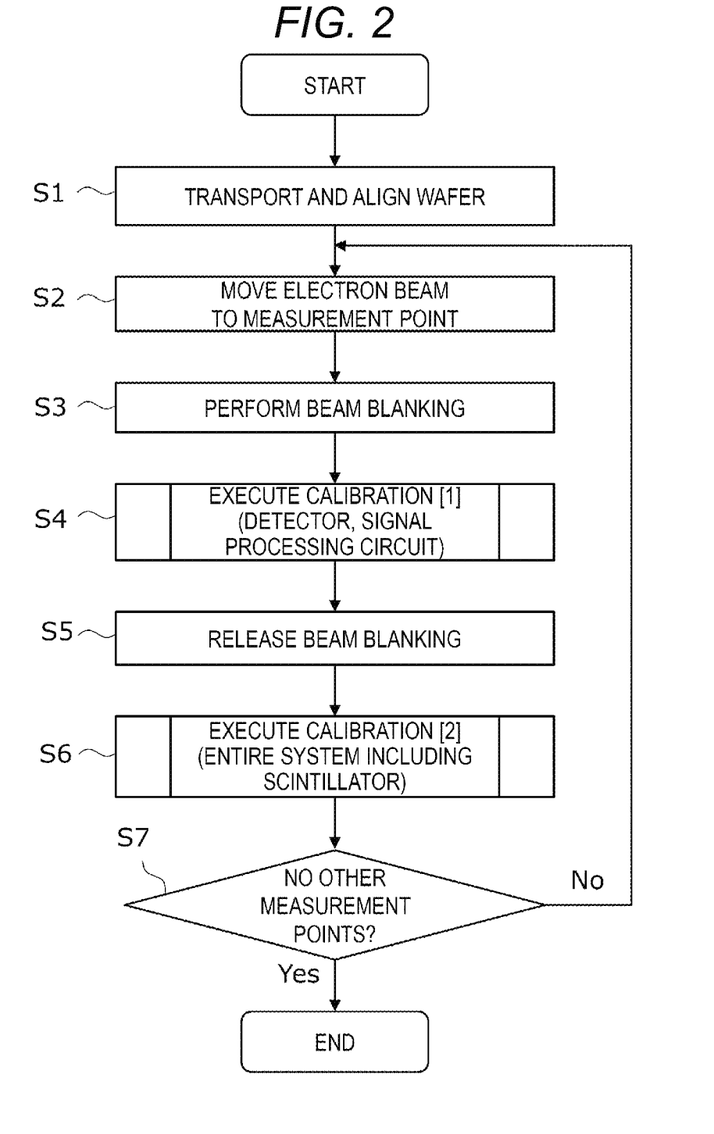
FIG. 2 is a flowchart showing an example of a method for calibrating the charged particle beam device of FIG. 1.

FIG. 2 is a flowchart showing an example of a method for calibrating the charged particle beam device of FIG. 1. In step S1 of FIG. 2, a predetermined transport device or the like places a semiconductor wafer as the sample 109 on the sample stage 111 provided in the column 100. Then, the charged particle beam device 10 aligns the semiconductor wafer by, for example, moving the sample stage 111.

Subsequently, in step S2, the deflector 104 or the like moves an irradiation position of the primary electron beam 102 discharged from the electron gun 101 to a measurement point on the sample 109. Next, in step S3, the charged particle beam device 10 blocks the primary electron beam 102 by blanking. Then, in step S4, the control units 122a and 122b execute a calibration [1] in a state in which the primary electron beam 102 is not emitted in accordance with Step S3, in other words, in a no-signal state.

In the calibration [1], the control units 122a and 122b schematically correct the characteristic variation between the plurality of channels in the detectors 106a and 106b and the signal processing circuits 121a and 121b using the setting values of the control parameters for each of the plurality of channels. Further, the control units 122a and 122b store the device data 128 associated with the calibration [1] in the memory 123. The device data 128 includes a no-signal image for each of the plurality of channels generated via the image processing unit 124 as a result of the calibration [1] and the setting values of the control parameters associated with the no-signal image.

Subsequently, in step S5, the charged particle beam device 10 releases the blanking. Then, in step S6, the control units 122a and 122b execute a calibration [2] in a state in which the primary electron beam 102 is emitted in accordance with step S5. In the calibration [2], the control units 122a and 122b schematically particularly correct the characteristic variation between the plurality of channels in the scintillators 105a and 105b, which are optical components, by using the setting values of the control parameters for each of the plurality of channels.

Further, the control units 122a and 122b store the device data 128 associated with the calibration [2] in the memory 123. The device data 128 includes a length measurement image for each of the plurality of channels generated via the image processing unit 124 as a result of the calibration [2] and the setting values of the control parameters associated with the length measurement image. The device data 128 associated with the calibration [1] and the calibration [2] can be displayed on the screen display unit 13. The control units 122a and 122b may output the device data 128 to the outside of the device. Specifically, for example, a device manufacturer may provide the device data 128 to a user of the charged particle beam device 10.

Next, in step S7, the charged particle beam device 10 determines whether another measurement point is present, and when another measurement point is present, the processing returns to step S2 and repeats the same processing. The calibration [1] and the calibration [2] are performed, for example, while appropriately scanning the measurement points, regardless of whether irradiated with the primary electron beam 102 or not. In this case, a plurality of measurement points serving can be determined as starting points.

By using such a calibration method, it is possible to correct an influence of the characteristic variation and the noise with high accuracy. As a comparative example, it is assumed that instead of the calibration in two stages as in the first embodiment, calibration in one stage is performed on the entire detection systems of the channels in the state in which the primary electron beam 102 is emitted. In this case, various variation factors included in the entire detection systems may affect a plurality of control parameters in a complicated manner. As a result, it is difficult to appropriately determine the setting values of the plurality of control parameters, which may reduce a calibration accuracy.

On the other hand, when the calibration in two stages as in the first embodiment is used, the characteristic variation between the plurality of channels can be corrected for the variation factors of the detectors 106a and 106b and the signal processing circuits 121a and 121b among the entire detection systems in step S4. Then, step S6 is performed after reflecting the setting values of the control parameters obtained in step S4, that is, after eliminating the characteristic variation of the detectors 106a and 106b and the signal processing circuits 121a and 121b.

In step S6, the characteristic variation between the plurality of channels can be corrected again for the variation factors of the entire detection systems, substantially the variation factors of the optical components such as the scintillators 105a and 105b arranged in the stages preceding to the detectors 106a and 106b among the entire detection systems. As a result, appropriate setting values of the control parameters can be easily obtained, and accuracy of the calibration can be improved.

Main Effects of First Embodiment

As described above, by using the method of the first embodiment, it is possible to correct the influence of the characteristic variation and the noise with high accuracy. As a result, a good SEM detection image can be obtained, and measurement accuracy can be improved. Further, by providing the device data 128 acquired by the calibration in two stages to the user of the charged particle beam device 10, the user can perform detailed offline analysis of the image. In this example, a configuration including the detection systems of the plurality of channels is taken as an example, but from a viewpoint of correcting the influence of the noise, a configuration including a detection system of one channel may be used as well.

Second Embodiment

Detailed Operation of Charged Particle Beam Device

Figure 3A:
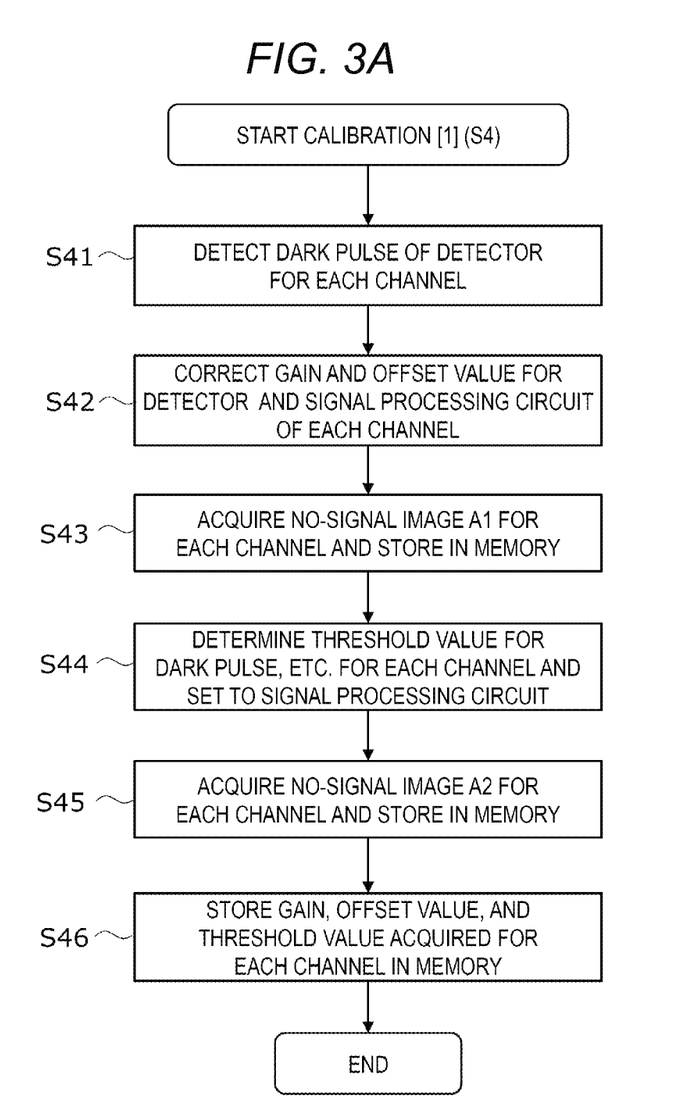
FIG. 3A is a flowchart showing an example of detailed contents of calibration [1] in FIG. 2 in a charged particle beam device calibration method according to a second embodiment of the invention.
Figure 3B:
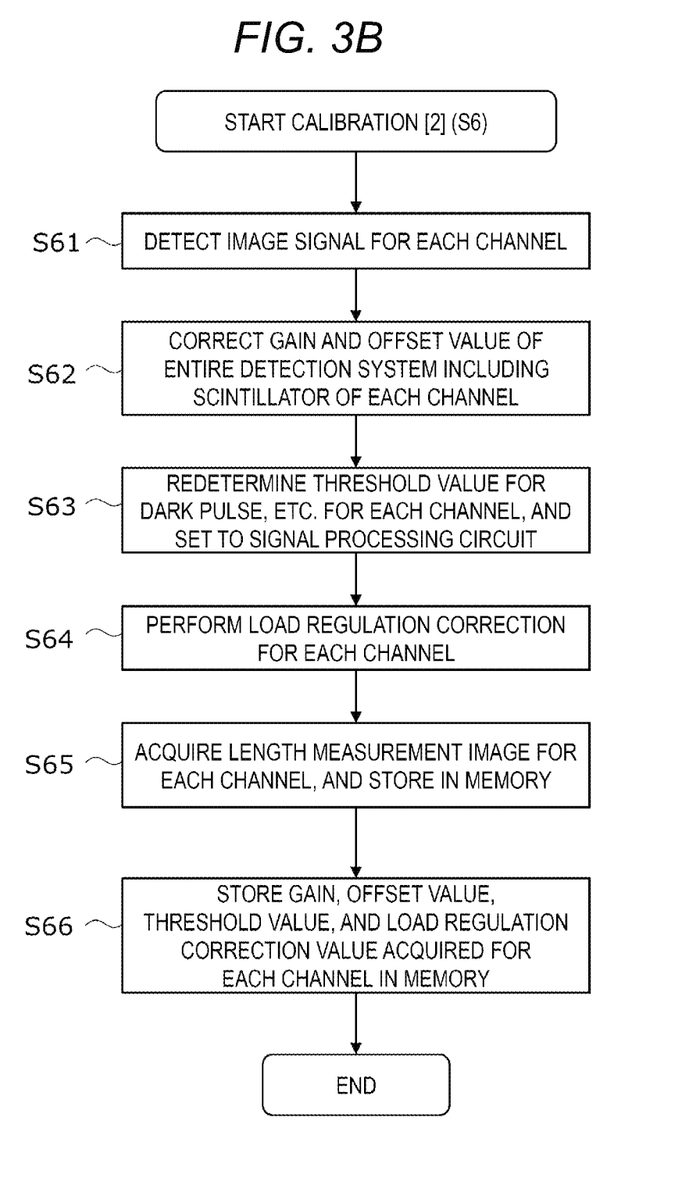
FIG. 3B is a flowchart showing an example of detailed contents of calibration [2] in FIG. 2 in the charged particle beam device calibration method according to the second embodiment of the invention.

FIG. 3A is a flowchart showing an example of detailed contents of the calibration [1] in FIG. 2 in a charged particle beam device calibration method according to a second embodiment of the invention. FIG. 3B is a flowchart showing an example of detailed contents of the calibration [2] in FIG. 2 in the charged particle beam device calibration method according to the second embodiment of the invention.

In the calibration [1] (step S4) of FIG. 2, first, as shown in FIG. 3A, the control units 122a and 122b detect the dark pulses of the detectors 106a and 106b for each channel (step S41). Further, the control units 122a and 122b correct the gains and the offset values for the detectors 106a and 106b and the signal processing circuits 121a and 121b of each channel so as to eliminate the characteristic variation between the plurality of channels (step S42). That is, the control units 122a and 122b search for the values of the bias control signals BCa and BCb and the gain adjustment signals GAa and GAb and the values of the offset adjustment signals OFa and OFb so as to eliminate the characteristic variation between the plurality of channels.

Subsequently, the control units 122a and 122b acquire a no-signal image A1 for each of the plurality of channels and store the no-signal image A1 in the memory 123 in a state in which the control parameters corrected in step S42, that is, the gains and the offset values are reflected (step S43). The no-signal image A1 is generated by, for example, scanning the primary electron beam 102 in a state in which the blanking of the primary electron beam 102 is maintained. Next, in step S44, the control units 122a and 122b determine, for each channel, the threshold value for removing the noise including the dark pulse from the signal amplitude histogram obtained for each channel. Then, the control units 122a and 122b set the noise removal signals NRa and NRb representing the determined threshold values to the signal processing circuits 121a and 121b, respectively.

Next, in a state in which the gains and the offset values in step S42 and the threshold values in step S44 are set, the control units 122a and 122b acquire a no-signal image A2 for each of the plurality of channels and store the no-signal image A2 in the memory 123 (step S45). In addition, the control units 122a and 122b store the setting values of each of the control parameters associated with the no-signal images A1 and A2, that is, the gain, the offset value, the threshold value, and the like of each channel in the memory 123 (step S46).

For example, the gain of the channel A in step S46 is a total value of the gain of the detector 106a and the gain of the signal processing circuit 121a. The gain of each channel may be calculated from, for example, a relationship of the gain of the detector 106a with respect to the bias control signal BCa and a relationship of the gain of the signal processing circuit 121a with respect to the gain adjustment signal GAa, which are stored in advance in the memory 123. The same applies to the gain of the channel B. Similarly, the offset value of each channel can also be calculated from relationships between the offset values of the signal processing circuits 121a and 121b with respect to the offset adjustment signals OFa and OFb.

Figure 4:
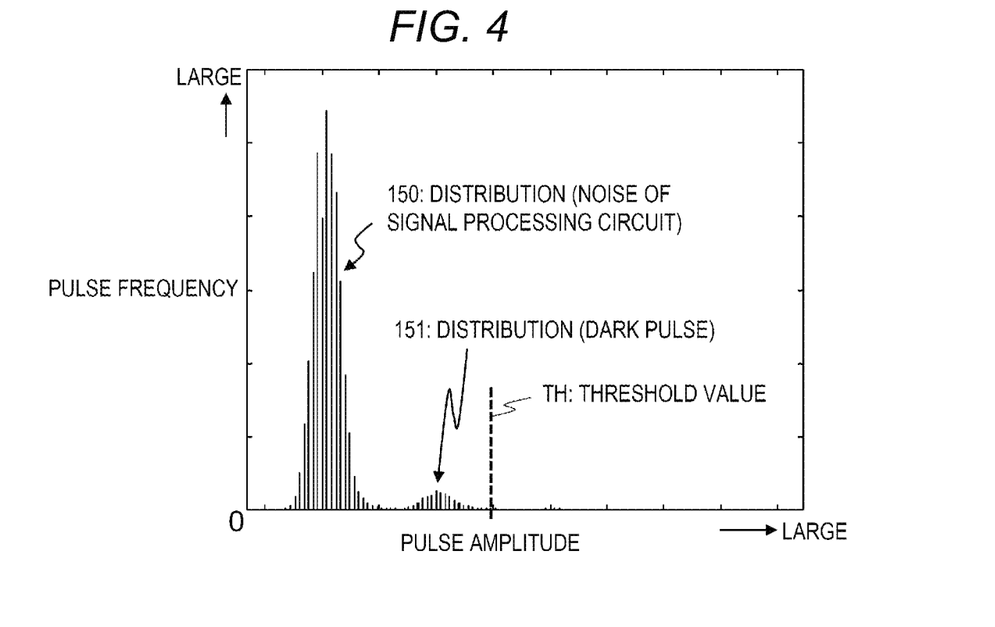
FIG. 4 is a diagram showing an example of a signal amplitude histogram used in the calibration of FIG. 3A.

FIG. 4 is a diagram showing an example of the signal amplitude histogram used in the calibration of FIG. 3A. For example, when the dark pulse is detected in step S41 of FIG. 3A, the primary electron beam 102 is scanned in a blanked state. As a result, the signal amplitude histogram as shown in FIG. 4 is obtained for each channel based on the output signals OTa and OTb of the signal processing circuits 121a and 121b. In FIG. 4, a horizontal axis represents a signal amplitude value, and a vertical axis represents a frequency for each amplitude value.

The signal amplitude histogram of FIG. 4 includes a distribution 150 caused by noise of the signal processing circuits 121a and 121b, specifically, noise of the analog-to-digital converters, etc., and a distribution 151 caused by the dark pulses from the detectors 106a and 106b. If the primary electron beam 102 is emitted, the signal amplitude histogram may additionally include various distributions associated with the signal components that are mixed with the respective distributions 150 and 151. Therefore, unlike the case of FIG. 4, it may be difficult to clearly distinguish the dark pulses and the like from the signal amplitude histogram.

In step S44 of FIG. 3A, a threshold value TH for removing the noise including the dark pulse can be determined based on the signal amplitude histogram as shown in FIG. 4. In addition, in step S42 of FIG. 3A, for example, the gain and the offset value of each channel may be corrected such that a distribution position of the signal amplitude value becomes equivalent in each channel in the signal amplitude histogram as shown in FIG. 4.

In the calibration [2] (step S6) of FIG. 2, first, as shown in FIG. 3B, the control units 122a and 122b detect an image signal for each channel (step S61). Specifically, the control units 122a and 122b detect the image signals based on the output signals OTa and OTb of the signal processing circuits 121a and 121b obtained by emitting and scanning the primary electron beam 102. The image signal may be, for example, a signal amplitude histogram similar to the case of FIG. 4.

Subsequently, the control units 122a and 122b correct the gains and the offset values of the entire detection systems including the scintillators 105a and 105b and the like of each channel so as to eliminate the characteristic variation between the plurality of channels (step S62). That is, the control units 122a and 122b search again for the values of the bias control signals BCa and BCb and the gain adjustment signals GAa and GAb and the values of the offset adjustment signals OFa and OFb so as to eliminate the characteristic variation between the plurality of channels. At this time, the control units 122a and 122b may perform the correction based on the signal amplitude histogram or the like.

Next, the control units 122a and 122b re-determine the threshold value of the dark pulse or the like, that is, the noise removal signals NRa and NRb for each channel, and set the threshold values to the signal processing circuits 121a and 121b (step S63). At this time, for example, the control units 122a and 122b may calculate the threshold value by reflecting the gain of each channel determined in step S62 of FIG. 3B to the relationship between the threshold value determined in step S44 of FIG. 3A and the gain of each channel determined in step S42.

Subsequently, the control units 122a and 122b perform a load regulation correction for each channel (step S64). Specifically, for example, the control units 122a and 122b set correction coefficients determined according to the characteristics of the bias power supplies 120a and 120b of the respective channels to the signal processing circuits 121a and 121b as the amplitude correction signals AMCa and AMCb, thereby correcting amplitudes of the detection signals DSa and DSb.

Figure 5A:
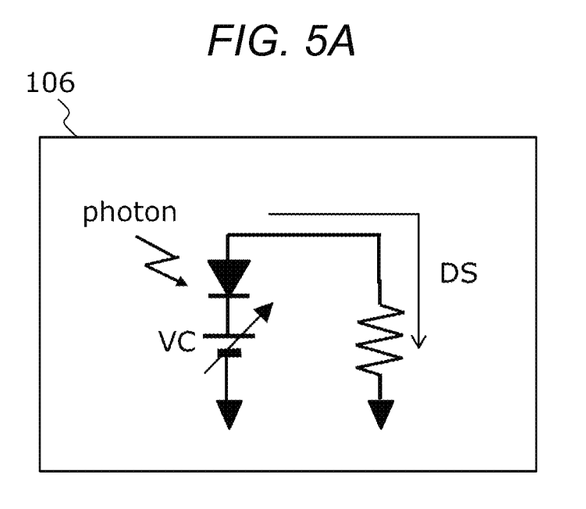
FIG. 5A is a diagram showing a content of a load regulation correction in FIG. 3B.
Figure 5B:
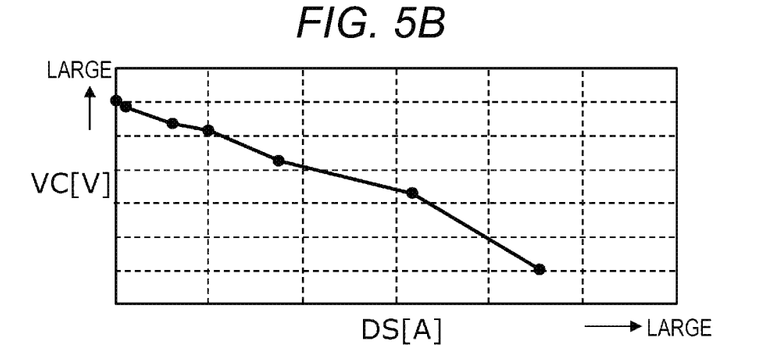
FIG. 5B is a diagram showing the content of the load regulation correction in FIG. 3B.

FIGS. 5A and 5B are diagrams showing contents of the load regulation correction in FIG. 3B. FIG. 5A shows an equivalent circuit of a detector 106. FIG. 5B shows an example of the characteristics of a bias voltage VB with respect to a detection signal DS from the detector 106. As shown in FIG. 5B, when an amplitude of the detection signal DS, for example, a current amplitude is increased, the bias voltage VB is reduced, and the amplitude of the detection signal DS may be reduced from a correct amplitude due to this influence. This reduction in amplitude may cause an increase in the characteristic variation of each channel.

Therefore, it is useful to correct the reduced amplitude to the correct amplitude. This correction is referred to as the load regulation correction. The correction coefficient for the load regulation correction is, for example, a coefficient representing a ratio of the reduced amplitude to the correct amplitude, and is a coefficient for returning the reduced amplitude to the correct amplitude.

After step S64 in FIG. 3B, in a state in which the gain and the offset value in step S62, the threshold value in step S63, and the load regulation correction value in step S64, that is, the correction coefficients are set, the control units 122a and 122b acquire the length measurement image for each of the plurality of channels, and store the acquired length measurement image in the memory 123 (step S65). The length measurement image is generated by emitting and scanning the primary electron beam 102. Further, the control units 122a and 122b store the setting values of each control parameter associated with the length measurement image, that is, the gain, the offset value, the threshold value, the load regulation correction value, and the like of each channel in the memory 123 (step S66).

The gain of each channel in step S62 can be calculated, for example, by comparing the gain with the signal amplitude histogram of the output signals OTa and OTb upon a reference gain stored in the memory 123 in advance. The offset value of each channel can also be calculated from the relationships between the offset values of the signal processing circuits 121a and 121b with respect to the offset adjustment signals OFa and OFb stored in the memory 123 in advance.

In particular, in a case where the detectors 106a and 106b are SiPMs or the like, the characteristics of the detectors 106a and 106b, for example, a level of the dark pulse may greatly change depending on an environmental temperature. The load regulation correction value may also vary depending on a type of the sample 109. Therefore, the calibration [1] of FIG. 3A and the calibration [2] of FIG. 3B may be performed by the user of the charged particle beam device 10, for example, each time the sample 109 is changed in a measurement process using the SEM.

Main Effects of Second Embodiment

As described above, by using the method of the second embodiment, the same effects as the various effects described in the first embodiment can be obtained. In particular, the threshold value of the noise including the dark pulse and the like can be determined with high accuracy by the calibration [1], and the threshold value can be adjusted according to a certain rule by the calibration [2]. In addition, even when a signal amplitude from the detectors 106a and 106b is large due to the load regulation correction in the calibration [2], the amplitude variation between the channels can be reduced. Further, it is possible to correct the variation in the measurement accuracy caused by a change in the environmental temperature.

Third Embodiment

Display Contents of Screen Display Unit

Figure 6:
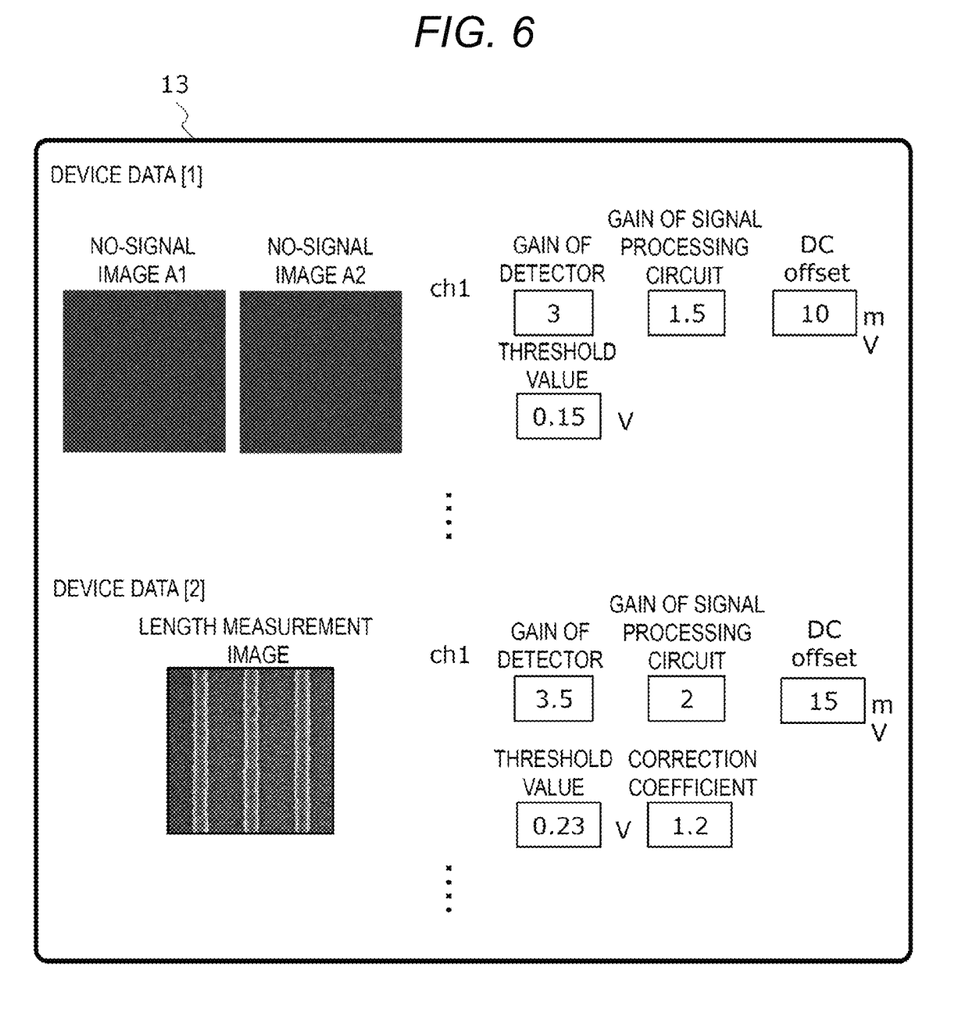
FIG. 6 is a diagram showing an example of display contents of a screen display unit of FIG. 1 in a charged particle beam device according to a third embodiment of the invention.

FIG. 6 is a diagram showing an example of display contents of the screen display unit of FIG. 1 in a charged particle beam device according to a third embodiment of the invention. The no-signal image A1 and the no-signal image A2 stored in step S43 and step S45 of FIG. 3A and the setting values of the control parameters associated with each no-signal image (A2 in this example) stored in step S46 are displayed on the screen display unit 13 of FIG. 6 as device data [1] associated with the calibration [1] for each channel. The setting values of the control parameters include the gain of the detector, the gain of the signal processing circuit, the offset value of the signal processing circuit, and the threshold value for removing the noise including the dark pulse and the like.

Further, the length measurement image stored in step S65 of FIG. 3B and the setting values of the control parameters associated with the length measurement image stored in step S66 are displayed on the screen display unit 13 of FIG. 6 as device data [2] associated with the calibration [2] for each channel. The setting values of the control parameters include the correction coefficient of the load regulation correction in addition to the gain of the detector, the gain of the signal processing circuit, the offset value of the signal processing circuit, and the threshold value for removing the noise including the dark pulse and the like.

The screen display unit 13 may display the pixel gradation histogram, the luminance value, the contrast value, or the like corresponding to each image in place of or in addition to the no-signal image A1, the no-signal image A2, and the length measurement image. The screen display unit 13 may display the bias voltages VBa and VBb and the bias control signals BCa and BCb of the detectors 106*a* and 106*b*. Further, when the detectors 106*a* and 106*b* are SiPMs or the like, the screen display unit 13 may display a breakdown voltage, a difference voltage between the breakdown voltage and the bias voltages VBa and VBb, a removal amount and a residual amount of the dark pulse, and the like.

Such device data [1] and device data [2] can be provided from the device manufacturer to the user of the charged particle beam device 10. In this case, the user can perform offline image analysis while displaying the provided device data [1] and device data [2] on the screen display unit 13. For example, the user can improve the measurement accuracy or reduce a device difference based on the device data [1] and the device data [2], or may determine whether to perform the calibration when performing the measurement.

Further, the screen display unit 13 is not limited to displaying the device data, and may use the same screen for receiving an input from the user regarding the setting values of the control parameters and outputting the received setting values to the control units 122*a* and 122*b* as setting value data 127 of FIG. 1. In this case, the control units 122*a* and 122*b* output the respective parameter control signals to the signal processing circuits 121*a* and 121*b* and the like based on the setting value data 127.

Main Effects of Third Embodiment

As described above, by using the method of the third embodiment, the same effects as the various effects described in the first embodiment can be obtained. In particular, it is possible to provide information useful for the offline image analysis to the user of the charged particle beam device 10.

What is claimed is:

1. A charged particle beam device, comprising:
   detection systems of a plurality of channels; and
   a control unit configured to control characteristics of the detection systems of the plurality of channels by using a setting value of a control parameter, wherein
   each of the detection systems of the plurality of channels includes:
      a detector configured to detect charged particles discharged from a sample in response to irradiation of a charged particle beam,
      an optical component arranged at a stage preceding to the detector, and
      a signal processing circuit configured to process a detection signal from the detector, and
   the control unit is configured to execute:
      a first calibration of correcting a characteristic variation between the plurality of channels in the detector and the signal processing circuit by using the setting value of the control parameter for each of the plurality of channels in a state in which the charged particle beam is not emitted, and
      a second calibration of correcting a characteristic variation between the plurality of channels in the optical component by using the setting value of the control parameter for each of the plurality of channels in a state in which the charged particle beam is emitted.

2. The charged particle beam device according to claim 1, further comprising:
   an image processing unit configured to generate an image based on an output signal from the signal processing circuit of each of the plurality of channels, wherein
   the control unit is configured to:
      store first device data in a memory, the first device data including an image for each of the plurality of channels generated via the image processing unit as a result of the first calibration and the setting value of the control parameter associated with the image,
      store second device data in a memory, the second device data including an image for each of the plurality of channels generated via the image processing unit as a result of the second calibration and the setting value of the control parameter associated with the image, and
      output the first device data and the second device data to an outside of the device.

3. The charged particle beam device according to claim 2, further comprising:
   a screen display unit configured to display the first device data and the second device data on a screen.

4. The charged particle beam device according to claim 1, wherein
   at a time of the second calibration, the control unit emits the charged particle beam in a state in which the setting value of the control parameter obtained in the first calibration is reflected in the detection systems of the plurality of channels.

5. The charged particle beam device according to claim 4, wherein
   the control unit is configured to:
      search for the setting value of the control parameter at a time of the first calibration, the setting value of the control parameter including a gain and an offset value for the detector and the signal processing circuit and a threshold value for removing a dark pulse from the detector, and
      search for the setting value of the control parameter at the time of the second calibration, the setting value of the control parameter including a gain and an offset value for the detector and the signal processing circuit, a threshold value for removing a dark pulse from the detector, and a correction coefficient in a load regulation correction for correcting an amplitude reduction of the detection signal from the detector.

6. A charged particle beam device, comprising:
   a detector configured to detect charged particles discharged from a sample in response to irradiation of a charged particle beam;
   an optical component arranged at a stage preceding to the detector;
   a signal processing circuit configured to process a detection signal from the detector; and
   a control unit configured to control characteristics of the detector and the signal processing circuit using a setting value of a control parameter, wherein
   the control unit is configured to execute a first calibration of searching for a setting value of the control parameter in a state in which the charged particle beam is not emitted, and a second calibration of searching for a setting value of the control parameter in a state in which the charged particle beam is emitted.

7. The charged particle beam device according to claim 6, wherein
at a time of the second calibration, the control unit emits the charged particle beam in a state in which the setting value of the control parameter obtained in the first calibration is reflected.

8. The charged particle beam device according to claim 6, further comprising:
an image processing unit configured to generate an image based on an output signal from the signal processing circuit, wherein
the control unit is configured to:
store first device data in a memory, the first device data including an image generated via the image processing unit as a result of the first calibration and the setting value of the control parameter associated with the image,
store second device data in a memory, the second device data including an image generated via the image processing unit as a result of the second calibration and the setting value of the control parameter associated with the image, and
output the first device data and the second device data to an outside of the device.

9. A charged particle beam device calibration method, the charged particle beam device including: detection systems of a plurality of channels each including a detector configured to detect charged particles discharged from a sample in response to irradiation of a charged particle beam; an optical component arranged at a stage preceding to the detector; and a signal processing circuit configured to process a detection signal from the detector, the charged particle beam device calibration method comprising:
performing a first calibration of correcting a characteristic variation between the plurality of channels in the detector and the signal processing circuit by using a setting value of a control parameter for each of the plurality of channels in a state in which the charged particle beam is not emitted; and
performing a second calibration of correcting a characteristic variation between the plurality of channels in the optical component by using a setting value of the control parameter for each of the plurality of channels in a state in which the charged particle beam is emitted.

10. The charged particle beam device calibration method according to claim 9, further comprising:
generating an image based on an output signal of the signal processing circuit for each of the plurality of channels as a result of the first calibration, and storing the image and the setting value of the control parameter associated with the image in a memory as first device data;
generating an image based on an output signal of the signal processing circuit for each of the plurality of channels as a result of the second calibration, and storing the image and the setting value of the control parameter associated with the image in a memory as second device data; and
outputting the first device data and the second device data to an outside of the device.

11. The charged particle beam device calibration method according to claim 9, further comprising:
at a time of the second calibration, emitting the charged particle beam in a state in which the setting value of the control parameter obtained in the first calibration is reflected in the detection systems of the plurality of channels.

12. The charged particle beam device calibration method according to claim 11, further comprising:
searching for the setting value of the control parameter at a time of the first calibration, the setting value of the control parameter including a gain and an offset value for the detector and the signal processing circuit, and a threshold value for removing a dark pulse from the detector; and
searching for the setting value of the control parameter at the time of the second calibration, the setting value of the control parameter including a gain and an offset value for the detector and the signal processing circuit, a threshold value for removing a dark pulse from the detector, and a correction coefficient in a load regulation correction for correcting an amplitude reduction of the detection signal from the detector.

13. The charged particle beam device calibration method according to claim 12, further comprising:
performing the first calibration and the second calibration each time the sample is changed.

* * * * *